Figure 1:
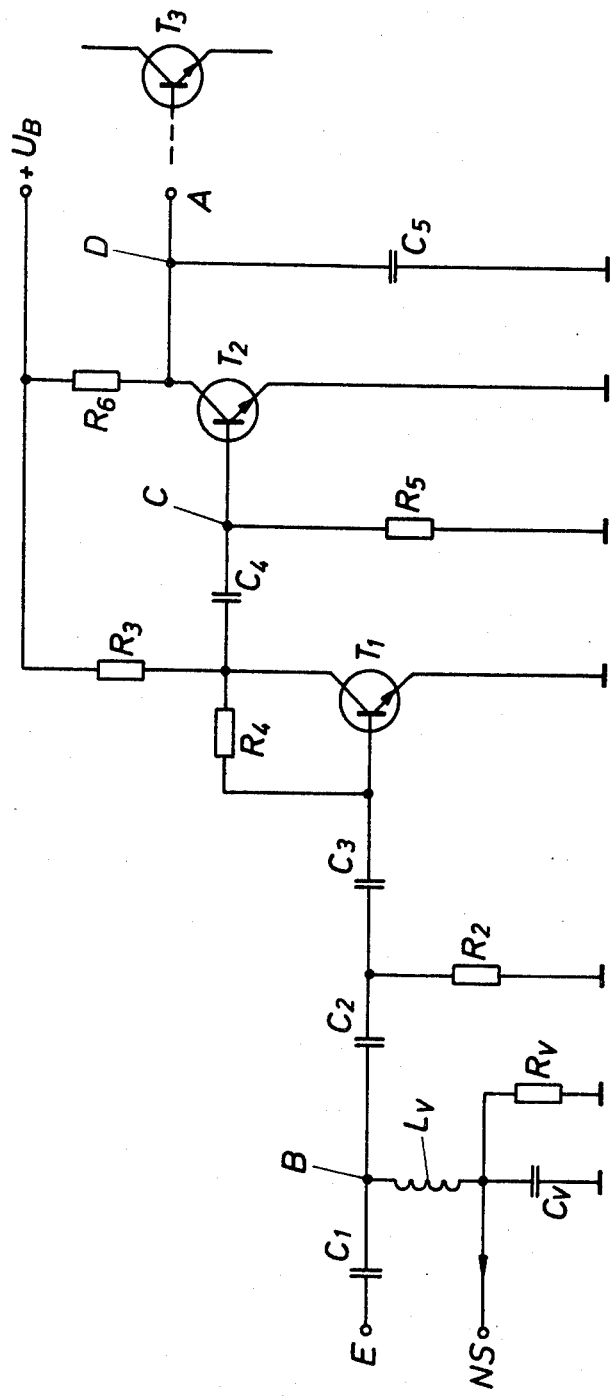

United States Patent [19]
Hansen

[11] 4,000,414
[45] Dec. 28, 1976

[54] INTERFERENCE PULSE DETECTOR CIRCUIT

[75] Inventor: Jens Hansen, Hildesheim, Germany

[73] Assignee: Blaupunkt-Werke GmbH, Hildesheim, Germany

[22] Filed: June 30, 1975

[21] Appl. No.: 591,317

[30] Foreign Application Priority Data
Sept. 12, 1974  Germany ............ 2443581

[52] U.S. Cl. .............. 307/233 R; 307/246; 307/295; 328/165; 325/478
[51] Int. Cl.$^2$ .............................. H03B 1/04
[58] Field of Search ......... 328/162, 163, 164, 165; 307/233, 246, 295; 325/477, 478

[56] References Cited
UNITED STATES PATENTS

| | | | |
|---|---|---|---|
| 3,191,123 | 6/1965 | Eness et al. | 325/477 X |
| 3,368,153 | 2/1968 | Garde | 307/246 X |
| 3,595,993 | 7/1971 | Pratt | 328/165 X |
| 3,647,950 | 3/1972 | Yoshikawa | 325/477 X |

Primary Examiner—John S. Heyman
Attorney, Agent, or Firm—William R. Woodward

[57] ABSTRACT

A circuit resonant at a frequency above the frequency band occupied by a signal to be protected is set into damped oscillations by high-frequency components of an interfering pulse and produces a voltage spike at the beginning of the interfering pulse. A differentiator circuit produces a close succession of a pair of oppositely polarized spikes in response to the spike produced by the resonant circuit, while substantially eliminating the rest of the signal and a switching transistor is caused to discharge a capacitor suddenly when the positive-going spike of the pair reaches it. The common connection point of the coil, capacitor and resistor of the resonant circuit is a point at which a delayed signal is obtained and the signal to be protected is thus provided with the benefit of this delay before it is subjected to blanking by the pulse produced at the collector of the switching transistor.

9 Claims, 2 Drawing Figures

INTERFERENCE PULSE DETECTOR CIRCUIT

This invention relates to a circuit for producing a pulse in response to the appearance of an interfering signal having frequency components lying outside the signal band of a signal which it is desired to protect. Pulses so produced are commonly used to blank out the protected signal momentarily to prevent the interfering signal from giving the protected signal a false value.

One application of such circuits is in ultrasonic remote control systems, where the protected control signal is interrupted by a pulse-forming circuit operating in response to receive signal components that can have been produced only by interfering disturbances. Another known application of such circuits is to suppress interference with a broadcast receiver, where the output of the demodulator of the receiver is interrupted when a disturbance is detected, but in this case there is generally provided an arrangement for storing the last undisturbed value of the signal and supplying that to the low-frequency stages during the blanking interval.

These known circuits utilize, for recognition of the presence of an interfering disturbance, a resonant circuit excited into damped oscillation by high-frequency components of a disturbance which are above the high-frequency end of the frequency range in which the signal to be protected is located. The damped oscillation thus produced is amplified and rectified by a diode bridge. The rectified oscillation is caused to switch over an otherwise non-conducting transistor and a resulting trigger pulse is taken from the output of that transistor to control a monostable multivibrator that produces the actual blanking pulse. The rectification of the damped oscillation by a diode bridge is necessary in this circuit, because the oscillation may begin either with a positive or a negative halfwave, according to whether the disturbing impulse starts with a positive-going or a negative-going leading edge (and, of course, it is desired to produce the trigger pulse without any unnecessary delay). Interference detecting circuits of this type are relatively expensive because of the number of components required.

It is an object of the present invention to provide a new circuit for recognizing the presence of an interfering signal and for producing a pulse suitable as a trigger pulse in response to such recognition, in which the new circuit a substantially smaller number of components will be required.

SUBJECT MATTER OF THE PRESENT INVENTION

Briefly, a frequency-dependent network is provided for selective modification of the amplitude of signal components outside of the frequency band of the signal to be protected and the so modified signal components are then provided to a differentiating circuit, of which the output is used to switch a transistor with a halfwave of the differentiated signal. In another aspect of the invention, such a frequency-dependent network is used and one reactive component thereof is utilized as a delay element for delaying the signal to be protected, so that the blanking pulse ultimately produced can be applied to a delayed signal and thus catch it at the beginning of the disturbance, without requiring the provision of any additional components in order to produce the delay. In this case, the frequency-dependent network has one output for the modified out-of-band components of the disturbing signal and another output for the delayed protected signal, these two outputs being taken at different terminals of a reactive component of the frequency-dependent network.

The switching transistor preferably produces a pulse useable as a trigger pulse as aforesaid by being switched into its conducting condition to discharge a capacitor which is thereafter recharged over a charging circuit resistor. The differentiator circuit utilizes one or more resistance-capacitor combinations in differentiating configuration. In a particularly advantageous form of the invention, one of these resistor-capacitor combinations is constituted by a capacitor cooperating with the input resistance of an amplifying transistor as the resistance element of the combination. Another such resistor-capacitor combination is preferably also used that is so dimensioned electrically as to provide substantial attenuation of the low-frequency components of the halfwaves of the differentiated signal.

Figure 2:
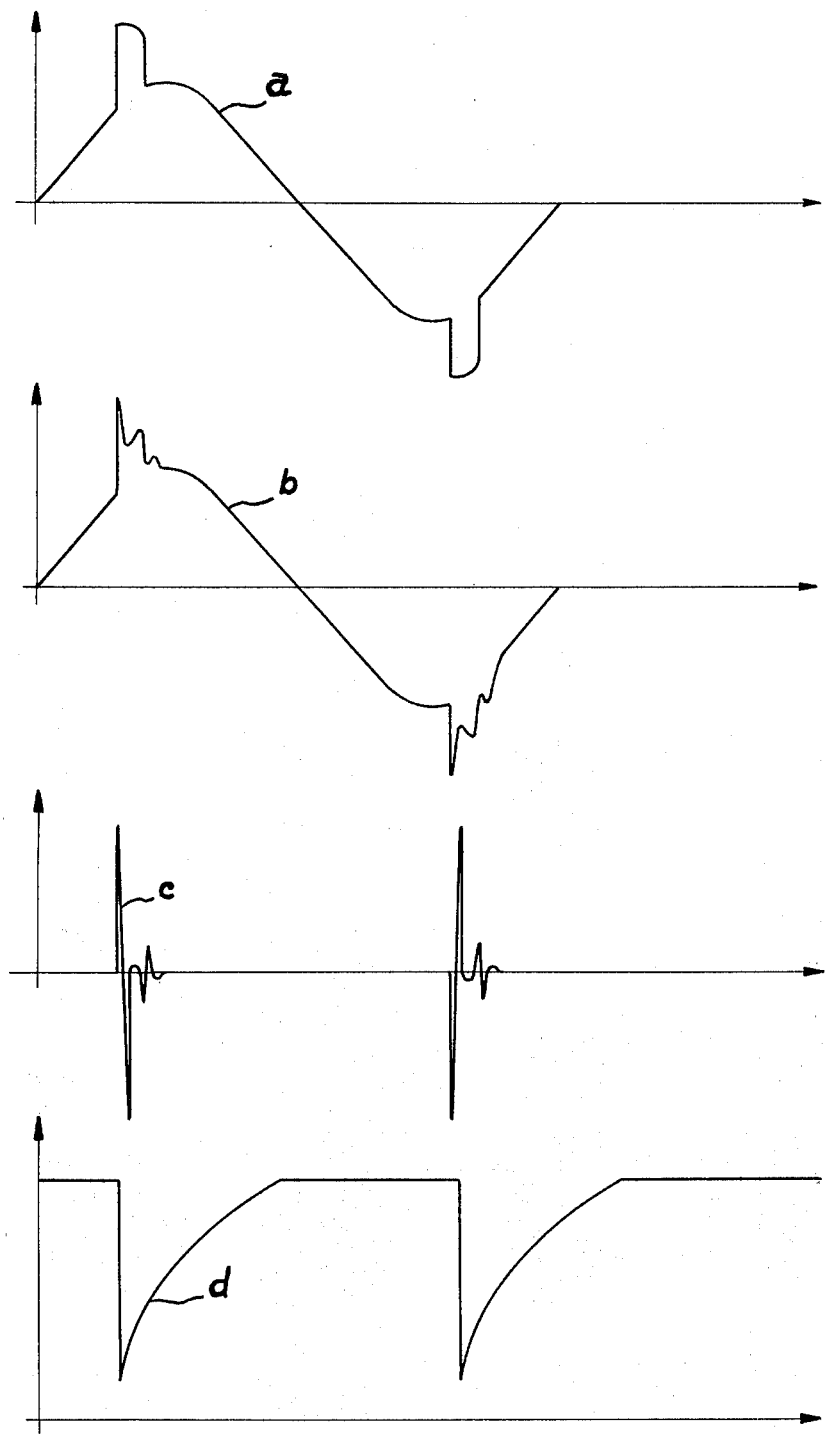

The invention is further described by way of illustrative example with reference to the accompanying drawings, in which:

FIG. 1 is a diagram of a circuit according to the invention for recognition of a disturbance pulse and producing a trigger pulse in response thereto, and FIG. 2 is a set of graphs drawn to the same time base showing the wave form at different points of the circuit for typical disturbance pulses.

The circuit shown in FIG. 1 by way of example shows the interference detection portion of an interference elimination circuit of a radio receiver embodying the present invention.

The signal appearing at the output of the demodulator (not shown) of the radio receiver is supplied, generally over a signal separation stage (likewise not shown), to the detector portion of the interference elimination circuit. The input coupling for this detector circuit portion is provided by a coupling capacitor $C_1$.

Interference elimination circuits commonly comprise a switching transistor interposed in the path of the protected signal and then, after the presence of an interfering signal is detected, the detector portion of the interference circuit produces an output pulse. During the blanking interval, the low-frequency amplifier of the receiver (not shown) is supplied an input voltage from a storage capacitor (likewise not shown) corresponding to the signal value immediately before the disturbance. In order that the blanking should take plane, not after the beginning of the disturbance, but at the same time or slightly before the beginning of the disturbance, the signal to be protected is commonly delayed before being subjected to blanking.

The interference detector portion of the circuit shown in FIG. 1 is equipped with a frequency-dependent network for selectively changing the amplitude of signal components lying outside the signal band of the protected signal, in this case a series resonant circuit $L_v$, $C_v$, $R_v$ composed of a coil $L_v$ in series with the parallel combination of a capacitor $C_v$ and a resistor $R_v$, the other end of which parallel combination is grounded. This series resonant circuit is connected to the coupling capacitor $C_1$ already mentioned. This series resonant circuit, which may be regarded as a trap circuit, is also useable to provide the delay element of the interference elimination circuit. For this purpose, the desired signal, that is, the signal to be protected, is taken from the circuit and supplied to following stages from the terminal designated NS, which is connected to the connection between the inductance $L_v$ with the parallel combination of the capacitor $C_v$ and the resistor $R_v$.

At point B of the circuit, where the coupling capacitor $C_1$ is connected to the coil $L_v$, an output is taken that is modified by the presence of the resonant circuit and connected through a capacitor $C_2$ to a resistor $R_2$ the other side of which is grounded. The ungrounded end of the resistor $R_2$, at which a differentiated signal appears, is subjected to a further differentiating action by passing it through another capacitor $C_3$ to the base of an amplifying transistor $T_1$, which has its emitter directly grounded and its collector connected over a load resistor $R_3$ to the positive supply voltage bus $+U_B$. The capacitor $C_3$ cooperates with the input resistance of the amplifying transistor $T_1$ to provide differentiation of the signal, in the same fashion as the resistance-capacitor combination $C_2$, $R_2$ also provides a differentiating action. Bias current is provided to the base of the transistor $T_1$ through the resistor $R_4$ which is connected to the collector of the transistor $T_1$ (thus, also producing some negative feedback).

The collector of the amplifying transistor $T_1$, also designated as point C of the circuit, is connected over a capacitor $C_4$ to the base of a switching transistor $T_2$, to which a resistor $R_5$ is connected that has its other end grounded. The emitter of the switching transistor $T_2$ is likewise connected to ground, while its collector (point D of the circuit of the circuit) is connected over a load resistor $R_6$ to the positive voltage supply bus $+U_B$. A charging capacitor $C_5$ is connected in parallel to the emitter-collector path of the switching transistor $T_2$. The output signal of the detector portion of the circuit is the voltage at the ungrounded plate of the capacitor $C_5$, which is connected to the collector of the switching transistor $T_2$, point D of the circuit, which output voltage is available at the terminal A for control of the blanking circuit (not shown). The output signal is a trigger pulse suitable for controlling an additional switching transistor shown symbolically as $T_3$ in FIG. 1 to interrupt the path of the protected signal when a disturbance is recognized by the detector portion of the circuit shown in FIG. 1.

The mode of operation of the circuit is best understood with reference to FIG. 2. In FIG. 2 the upper curve $a$ represents a time segment of the signal delivered by the demodulator of the receiver, that is here shown to include two disturbance pulses, of which the first begins with a positive-going leading edge and the second begins with a negative-going leading edge. The disturbances characteristically begin with a very steep leading edge, while their trailing edges in general are of substantially less steepness.

For the input signal shown in curve $a$, there is then produced at point B of the circuit a signal represented by curve $b$ of FIG. 2, the second curve from the top. The delay circuit $L_v$, $C_v$, $R_v$ operating in this case as a trap circuit, eliminates from the input signal spectrum those frequency components that lie in its resonance region. The disturbance pulse that is present is thereby distorted or reshaped and, in its modified form, it consists essentially of a steep spike followed by two broader pulses superimposed on the trailing edge of the sharp spike.

At the base electrode of the amplifying transistor $T_1$, and therefore also at the collector of the amplifying transistor $T_1$, identified as point C of the circuit, there appears a signal produced by differentiation of the signal distorted by the trap circuit $L_v$, $C_v$, $R_v$. The main portion of the differentiated signal is produced by the already mentioned steep spike of the signal represented in curve $b$ and consists of a sharp positive spike followed by a sharp negative spike. The broader pulses of curve $b$ produces no significant residual signals at point C.

The low-frequency components of this signal are attenuated by the capacitor $C_4$ that in cooperation with the resistor $R_5$, both being of suitable electrical dimensions for this purpose, has a pulse-shaping effect such that the width of the positive and negative spikes is reduced and that the amplitudes reduced by low-frequency components of the signal are increased. In consequence, there is an effect of bringing close to equality the magnitude of the two oppositely directed spikes, which at the output of the circuit are of only slightly differing amplitudes. The spikes thus produced are represented in curve $c$ of FIG. 2, the third curve from the top of the figure and they produce voltage pulses at the ungrounded end of resistor $R_5$ (point C of the circuit) that constitute the control voltage applied to the base of the switching transistor $T_2$.

The transistor $T_2$, which is normally in the nonconducting condition, is switched on by positive pulses, whereas the negative pulses on its base have no effect. Since even for the case of disturbance pulses that begin with a negative-going leading edge the positive pulse at point C of the circuit follows very quickly after the negative spike, the switching operation of the transistor $T_2$ occurs in every case very quickly after the beginning of the disturbance. Since the signal to be protected is delayed before it reaches the transistor $T_3$, which interrupts the path of the protected signal when a disturbance occurs, the switching operation of the transistor $T_2$ occurs in time even when the disturbance pulse begins with a negative-going leading edge.

As soon as the switching transistor $T_2$ is made conducting, the capacitor $C_5$ is suddenly discharged to the residual suddenly voltage of the switching transistor $T_2$ in its conducting condition. After the switching transistor $T_2$ is switched off, the charging capacitor $C_5$ is recharged through the resistor $R_6$.

The discharge of the capacitor $C_5$ blocks the transistor $T_3$, quickly putting it into its nonconducting condition. Shortly before the end of the charging up of the capacitor $C_5$, the voltage at the base of the blanking switch transistor $T_3$ is great enough to switch the transistor $T_3$ back into its conducting condition. That ends the blanking interval. It is readily seen from the foregoing description that the length of the blanking interval can be varied by changing the value of the resistor $R_5$.

If during the charging up of the capacitor $C_5$ a new interference pulse appears, the capacitor $C_5$ will again be fully discharged, and the blanking interval will be timed from the occurrence of the last interfering pulse. That is a practical mode of operation, since the new disturbance should also be blanked out. This desirable result would not be produced if a disturbance beginning during a blanking interval would have no effect.

The interference-detection circuit for producing a blanking trigger pulse as above described can perform the function of the known circuits in a new way that requires only a minimum of circuit components.

Although the invention has been described with reference to a specific illustrative example, it will be understood that variations are possible within the inventive concept. Thus, the bias resistor $R_4$ could be connected to the positive voltage bus instead of to the collector of transistor $T_1$, for one example of such a variation.

I claim:

1. A circuit for generating a pulse upon the occurrence of interfering signals having a frequency outside the frequency band of signals which it is desired to utilize, said circuit comprising:

a frequency responsive network ($L_v$, $C_v$, $R_v$) including a circuit means having at least one resonance maximum within said frequency band of desired signals and connected so as to be subjected to said interfering signals and said desired signals and to attenuate said desired signals at a point in said circuit where said interfering signals are substantially not attenuated;

a differentiator circuit ($C_2$, $R_2$, $C_3$, $T_1$) having its input connected to said point in said circuit of said network and having an output providing differentiated signals derived from said interfering signals, and a switching transistor ($T_2$) responsive to said output of said differentiator circuit and connected in circuit for producing a pulse in response to the first half wave of a predetermined polarity which is produced at said output of said differentiator circuit.

2. A circuit as defined in claim 1, comprising also a charging capacitor ($C_5$) and a charging circuit resistor ($R_6$) connected in the output circuit of said switching transistor for producing a pulse by discharge of said capacitor ($C_5$) when said switching transistor is put into its conducting condition by a half wave of the output of said differentiator circuit, followed by recharging of said capacitor ($C_5$) through said charging circuit resistor ($R_6$).

3. A circuit as defined in claim 1, in which said differentiator circuit comprises at least one RC differentiating combination of which one such combination comprises a capacitor ($C_3$) cooperating with the input resistance of an amplifying transistor ($T_1$) to provide signal differentiation.

4. A circuit as defined in claim 3, in which there is provided in said differentiator circuit ($C_2$, $R_2$, $C_3$, $C_1$, $C_4$, $R_5$) a second capacitor ($C_4$) and a resistor ($R_5$) in a circuit configuration providing differentiation, said second capacitor and said resistor being of such electrical dimensions as to attenuate the low-frequency components of the halfwaves of the differentiated signal.

5. A circuit as defined in claim 1, in which said circuit means of said network has a second point therein at which said desired signals are not attenuated and are delayed and in which said second point is connected to provide a second output of said network for supplying said desired signals to other circuits.

6. A circuit as defined in claim 5, in which said second output of said network is connected to the input of a series of stages of a radio receiver at least one of which is arranged to be blanked by the pulse output of said switching transistor ($T_2$).

7. A circuit as defined in claim 5, in which said circuit means of said network is a series resonant circuit composed of an inductor ($L_v$), a capacitor ($C_v$) and a resistor ($R_v$) and in which said first point is a terminal of said inductor, said second point is a common connection of said inductor and of said capacitor and said resistor is connected in parallel with said capacitor and grounded at the common connection of said resistor and said capacitor which is not connected to said second point.

8. A circuit as defined in claim 5, in which said differentiator circuit comprises at least one RC differentiating combination of which one such combination comprises a capacitor ($C_3$) cooperating with the input resistance of an amplifying transistor ($T_1$) to provide signal differentiation.

9. A circuit as defined in claim 8, in which there is provided in said differentiator circuit ($C_2$, $R_2$, $C_3$, $C_1$, $C_4$, $R_5$) a second capacitor ($C_4$) and a resistor ($R_5$) in a circuit configuration providing differentiation for attenuating the low-frequency components of the half waves of the differentiated signal.

* * * * *